(12) United States Patent
Wang et al.

(10) Patent No.: US 7,009,248 B2
(45) Date of Patent: Mar. 7, 2006

(54) SEMICONDUCTOR DEVICE WITH ASYMMETRIC POCKET IMPLANTS

(75) Inventors: Yin-Pin Wang, Kaohsiung (TW); Chin-Sheng Chang, Hsin-Chu (TW)

(73) Assignee: Taiwan Semiconductor Manufacturing Co., Ltd., (TW)

( * ) Notice: Subject to any disclaimer, the term of this patent is extended or adjusted under 35 U.S.C. 154(b) by 21 days.

(21) Appl. No.: 10/677,676

(22) Filed: Oct. 2, 2003

(65) Prior Publication Data
US 2005/0073013 A1 Apr. 7, 2005

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ............... 257/344; 257/345; 257/404; 257/408

(58) Field of Classification Search ......... 257/344, 257/345, 404, 408
See application file for complete search history.

(56) References Cited

U.S. PATENT DOCUMENTS

| 4,376,947 | A | 3/1983 | Chiu et al. | |
| 4,698,787 | A | 10/1987 | Mukherjee et al. | |
| 4,868,619 | A | 9/1989 | Mukherjee et al. | |
| 5,449,937 | A * | 9/1995 | Arimura et al. | 257/345 |
| 5,895,238 | A * | 4/1999 | Mitani | 438/232 |
| 6,171,913 | B1 | 1/2001 | Wang et al. | |
| 6,255,174 | B1 | 7/2001 | Yu | |
| 6,255,177 | B1 | 7/2001 | Fang et al. | |
| 6,344,405 | B1 | 2/2002 | Saha | |
| 6,563,176 | B1 * | 5/2003 | Gauthier et al. | 257/360 |
| 2003/0006460 | A1 * | 1/2003 | Aoki et al. | 257/344 |
| 2004/0061187 | A1 * | 4/2004 | Weber et al. | 257/408 |
| 2004/0099890 | A1 * | 5/2004 | Umimoto et al. | 257/288 |

FOREIGN PATENT DOCUMENTS

FR 2796204 7/1999

OTHER PUBLICATIONS

Shinji Odanaka et al., "Potential Design And Transport Property Of 0.1-um MOSFET With Asymmetric Channel Profile", IEEE Transactions On Electron Devices, vol. 44, No. 4, Apr. 1997.

* cited by examiner

Primary Examiner—Ngân V. Ngô
(74) Attorney, Agent, or Firm—Duane Morris LLP

(57) ABSTRACT

A semiconductor device (1) has a source (2) a gate (3) and a drain (4), a single deep-pocket ion implant (8) in a source-drain depletion region, and a single shallow-pocket ion implant (9) in the source-drain depletion region.

6 Claims, 19 Drawing Sheets

SEMICONDUCTOR DEVICE WITH ASYMMETRIC POCKET IMPLANTS

FIELD OF THE INVENTION

The present invention relates to a semiconductor device with a single deep-pocket ion implant and a single shallow-pocket ion implant to counter short channel effects, SCE.

BACKGROUND OF THE INVENTION

U.S. Pat. No. 6,344,405 discloses a semiconductor device that comprises, a source, an oxide-supported gate and a drain, which extend lengthwise along a substrate. The device requires a threshold voltage $V_t$ to turn on the device, from a nonconductive, off state. Leakage currents near the source and drain tend to occur within a source depletion region and a drain depletion region. These depletion regions are in the substrate beneath the oxide-supported gate, and between the source and the drain. The source and drain depletion regions electrically couple to the transistor source and the transistor drain, respectively, which contributes to leakage current.

When the length of the gate, $L_{gate}$, is made desirably smaller, for example, when $L_{gate}$ decreases below 0.1 μm (micrometers), these depletion areas have a tendency for electrically coupling to each other, which increases the likelihood of a leakage current between the source and the drain. Such an electrical coupling, as $L_{gate}$ decreases, is referred to as, a short channel effect (SCE), or alternatively as, a punch through effect.

SUMMARY OF THE INVENTION

The present invention counters the punch through effect or SCE by providing a semiconductor device having a deep-pocket ion implant in a deep source-drain depletion region, and further having a shallow-pocket ion implant in a shallow source-drain depletion region. Various embodiments of the present invention counter variations in the punch through effect or SCE by having implants in different locations. Another embodiment of the present invention resides in a method of fabricating a semiconductor device to counter the punch through effect or SCE.

Embodiments of the present invention will now be described by way of example with reference to the accompanying drawings.

DETAILED DESCRIPTION

Figure 1:
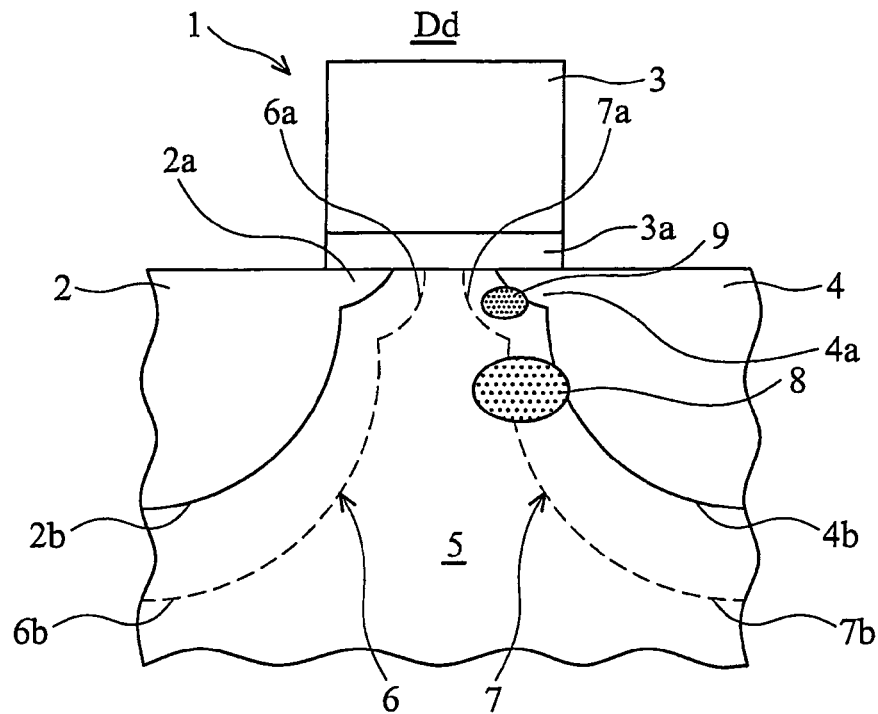
FIG. 1 is a schematic view of an embodiment of a semiconductor device having shallow and deep pocket ion implants at a drain side of the semiconductor device.

With reference to FIG. 1, an embodiment of the present invention, which is indicated as Dd, resides in a semiconductor device 1 comprising: a source 2, an oxide-supported gate 3, supported on a film of oxide 3a, and a drain 4, all of which are supported lengthwise on a semiconducting substrate 5.

The source 2 includes a shallow source extension 2a and a deep source portion 2b in a source-drain region. The drain 4 includes a shallow drain extension 4a and a deep drain portion 4b in the source-drain region. The source-drain region is in the substrate 5 under the gate 3. The source-drain region extends lengthwise to include the source 3 and the drain 4. The source-drain region has a shallow source-drain region between the source extension 2a and the drain extension 4a. The source-drain region has a deep source-drain region between the deep source portion 2b and the deep drain portion 4b. For example, the semiconductor device 1 is a field effect transistor, FET. An FET comprises either a PMOSFET, a p-type metal oxide silicon field effect transistor, or an NMOSFET, an n-type metal oxide silicon field effect transistor.

The semiconductor device 1 has a source depletion region 6. The source depletion region 6 includes a shallow source depletion region 6a and a deep source depletion region 6b. The semiconductor device 1 has a drain depletion region 7. The drain depletion region 7 includes a shallow drain depletion region 7a and a deep drain depletion region 7b. The source-drain depletion region is between the source 2 and the drain 4. The source-drain depletion region is in the substrate 5 under the gate 3, and is where the SCE or punch through effect can occur.

With further reference to FIG. 1, asymmetric pocket implants are provided to counter the SCE or punch through effect. They are single pocket implants that are asymmetric relative to a vertical central axis of the semiconductor device 1, as viewed in FIG. 1. The semiconductor device 1 has a deep-pocket ion implant 8 in the deep source-drain depletion region. A shallow-pocket ion implant 9 is in the shallow source-drain depletion region. For a PMOSFET, both the deep-pocket ion implant 8 and the shallow-pocket ion implant 9 are N-doped with respective concentrations of N-doped ions. The respective concentrations of N-doped ions are either equal or different. For an NMOSFET, both the deep-pocket ion implant 8 and the shallow-pocket ion implant 9 are P-doped with respective concentrations of P-doped ions. The respective concentrations of P-doped ions are equal or different. The structure described above with reference to FIG. 1 applies similarly to each of the embodiments disclosed in FIGS. 2–4.

The embodiment of FIG. 1 discloses the deep pocket implant 8 at the drain side, meaning, closer to the drain 4 than to the source 2. The deep pocket implant 8 at the drain side is in the drain depletion region 7. The shallow pocket ion implant 9 is at the drain side, and in the drain depletion region 7.

Figure 2:
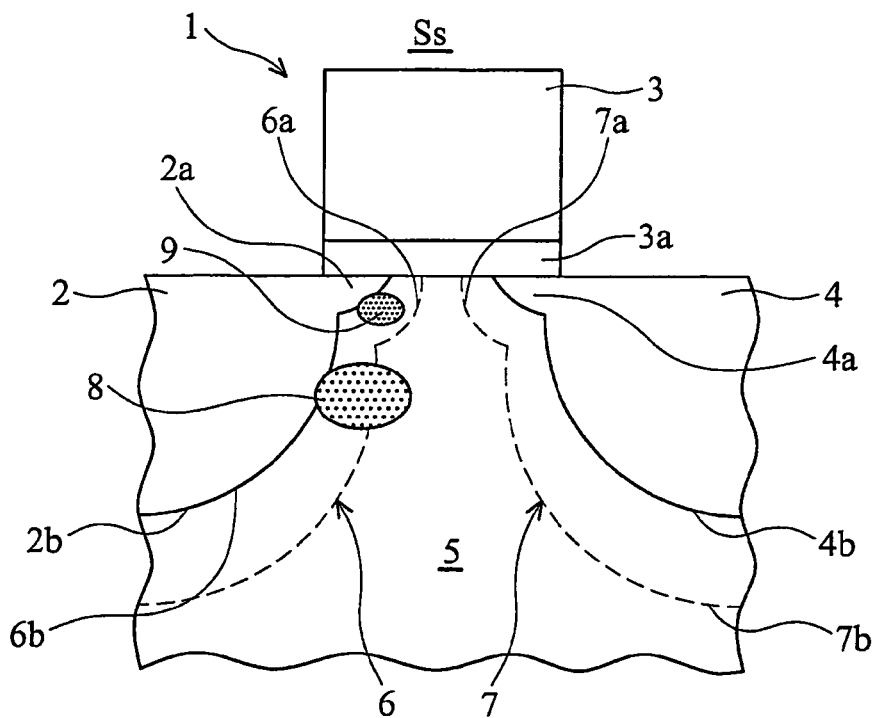
FIG. 2 is a schematic view of an embodiment of a semiconductor device having shallow and deep pocket ion implants at a source side of the semiconductor device.

FIG. 2 discloses another embodiment of the present invention that is indicated as Ss. With reference to FIG. 2, the deep-pocket ion implant 8 is at the source side, meaning closer to the source 2 than to the drain 4. The deep-pocket ion implant 8 is in the source depletion region 6. The shallow-pocket ion implant 9 is in the substrate 5 at the source side and in the source depletion region.

Figure 3:
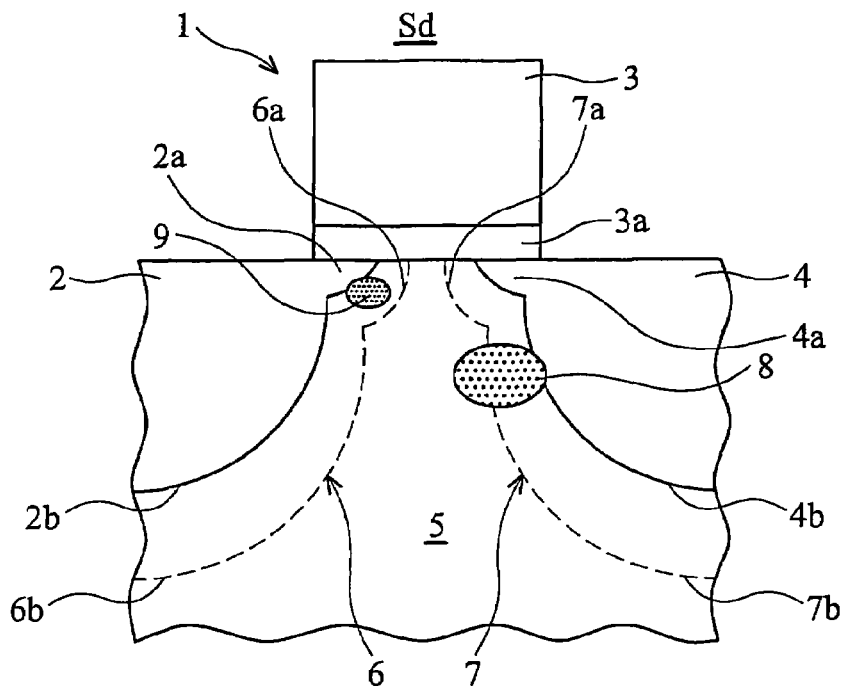
FIG. 3 is a schematic view of an embodiment of a semiconductor device having shallow and deep pocket ion implants, respectively, at a source side and a drain side of the semiconductor device.

FIG. 3 discloses another embodiment of the present invention that is indicated as Sd, in which a deep-pocket ion implant 8 and a shallow-pocket ion implant 9 are provided in staggered configuration. The deep-pocket ion implant 8 is at the drain side, and in the drain depletion region 7. The shallow pocket ion implant 9 is at the source side, and in the source depletion region 6. As shown in FIG. 3, the semiconductor device 1 has only one of each of the deep-pocket ion implant 8 and the shallow-pocket ion implant 9.

Figure 4:
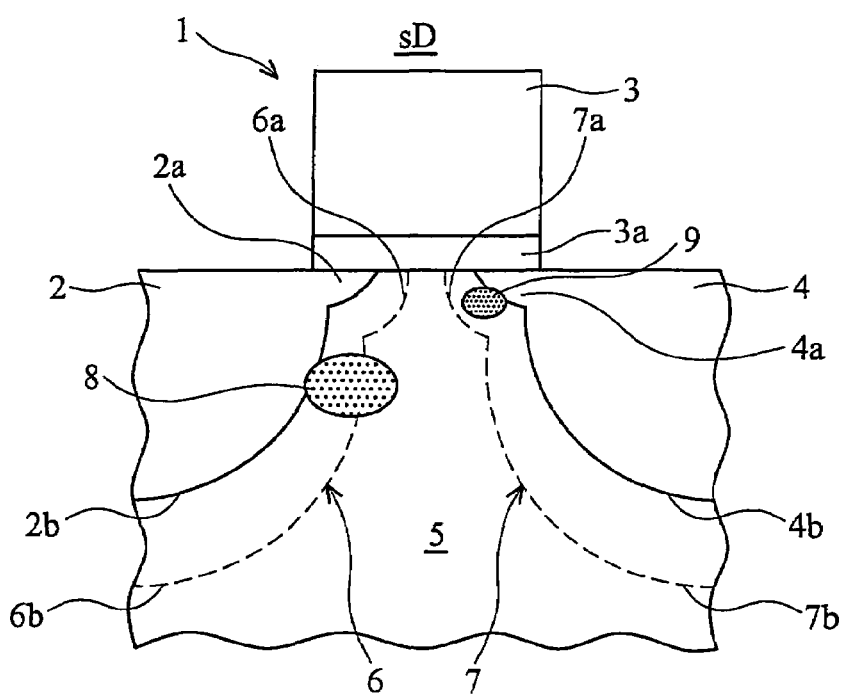
FIG. 4 is a schematic view of another embodiment of a semiconductor device having shallow and deep pocket ion implants, respectively, at a drain side and a source side, respectively, of the semiconductor device.

FIG. 4 discloses another embodiment in which a deep-pocket ion implant 8 and a shallow-pocket ion implant 9 are provided in a staggered configuration that is indicated as sD. In this embodiment, the deep pocket ion implant 8 is at the source side, and in the source depletion region 6. The shallow-pocket ion implant 9 is at the drain side, and in the drain depletion region 7. As shown in FIG. 4, the semiconductor device 1 has only one of each of the deep-pocket ion implant 8 and the shallow-pocket ion implant 9.

FIGS. 1–4 disclose the asymmetric deep pocket implant 8 and the asymmetric shallow pocket implant 9 in different locations to provide countering adjustments that counter the variations in the punch through effect or SCE.

With reference to FIGS. 5–9, a process of sequential process steps will now be described for making a semiconductor device 1 with an asymmetric pocket implant. First, conventional process steps form the substrate 5, and an oxide film under the gate 3. Further conventional process steps form the gate 3.

Figure 5:
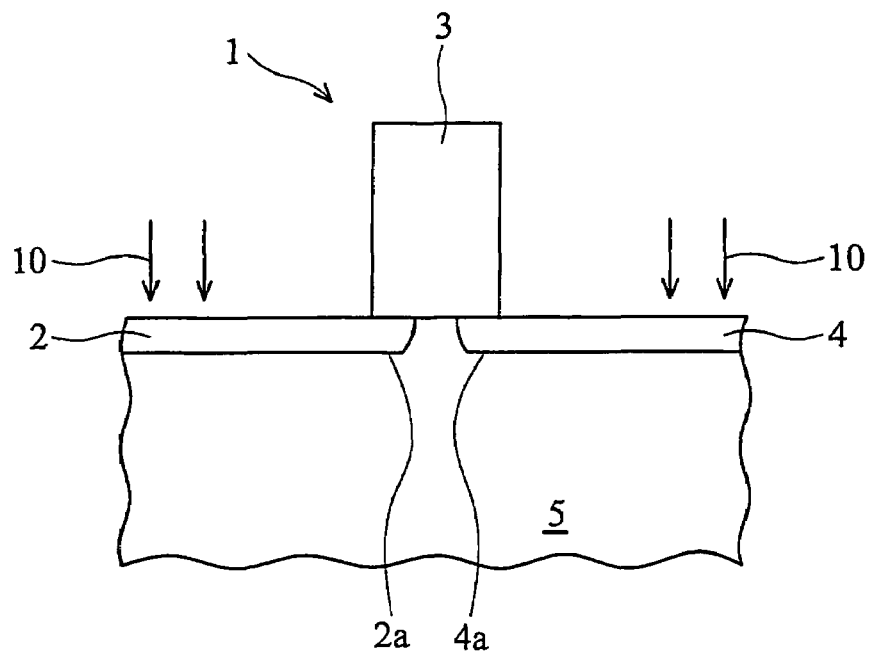
FIG. 5 is a schematic view of a lightly doped drain implant process step.

FIG. 5 discloses a process step of lightly doped drain and source implantation. This process step is a shallow ion implantation at zero tilt angle. Implanted ion impurities form light doped source and drain regions of a transistor. For example implanted Arsenic, As, forms light doped source and drain regions for NMOS transistors. Further, for example, Boron and/or Boron Fluoride, B and $BF_2$, impurities form light doped source and drain regions for PMOS transistors. The impurities are implanted with a zero tilt angle. The impurities are impelled vertically along the vertical vector 10 in FIG. 5. For example, the light doped source 2a and the light doped drain 4a are formed simultaneously by the first process step.

Figure 6:
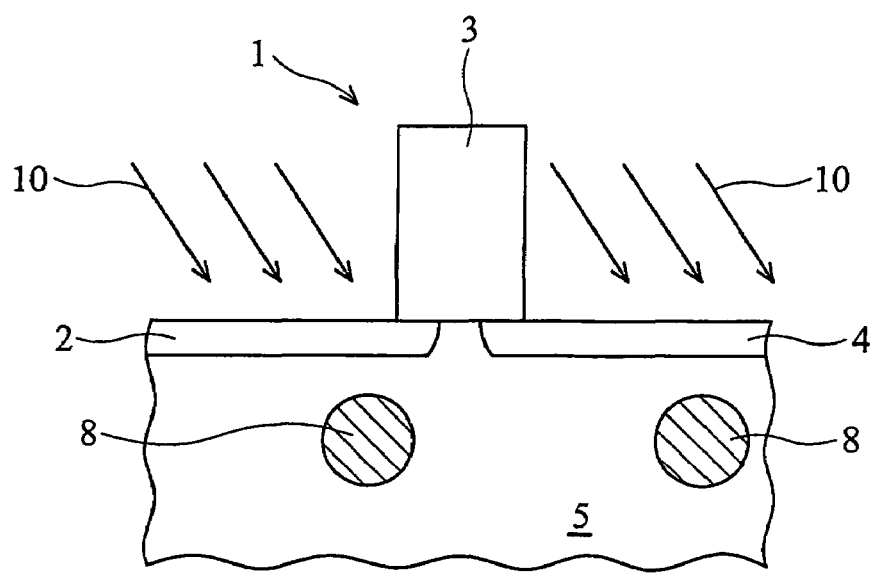
FIG. 6 is a schematic view of a tilted pocket implant process step to produce first and second ion implants.

FIG. 6 discloses a process step of deep pocket ion implantation at a tilt angle to form a set of two deep pocket ion implants 8. Implanted ion impurities are formed simultaneously in the substrate 5. The tilt angle is tilted toward the source side of the semiconductor device 1 to form a primary implant 8 at the source side of the semiconductor device 1, and form a secondary implant 8 at the drain side of the semiconductor device 1.

The primary implant 8 is formed under the gate 3 on either the source side or the drain side, depending on the direction of the tilt angle. Although not shown, the tilt angle can be tilted to form a drain side, primary implant 8, at the drain side of the semiconductor device 1, wherein such primary implant 8 is under the gate 3 at the drain side of the semiconductor device 1.

A secondary implant 8 is formed at the drain side of the semiconductor device. This secondary implant 8 will be countered by performance of such further process steps to be discussed with reference to FIGS. 7–9. According to the invention, the primary implant 8 becomes a single ion implant and an asymmetric ion implant when the secondary implant 8 is countered.

A process step disclosed by FIG. 6 applies to implantation of either shallow or deep ion implants 8 or 9, depending on the strength of the implantation energy to impel the implants either shallow or deep, and further depending on the ion concentrations that dissipate the implantation energy. Further, the tilt of the implant angle from shallow (larger tilt angle) to steep (smaller tilt angle) affects the implant depth from shallow to deep, respectively.

The process step of FIG. 6 is capable of being repeated to form another set of primary and secondary shallow-pocket ion implants 9. For example, the process of FIG. 6 can be repeated to form a set of two shallow ion implants 9, to be further disclosed by FIG. 12.

Figure 7:
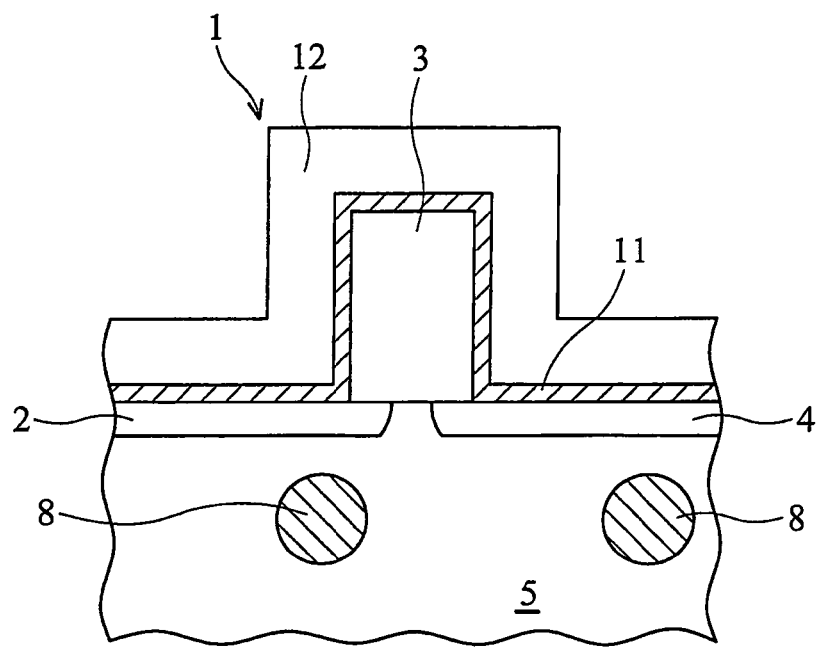
FIG. 7 is a schematic view of a $Si_3N_4$ process step and an $SiO_2$ process step.

FIG. 7 discloses a first process step of forming a thin layer 11 of $SiO_2$ an insulating barrier on the substrate 5 and on each gate 3 on the substrate. The thin layer 11 of $SiO_2$ is formed by TEOS (Tetraethoxysilane), by way of example. Another process step of forming a thicker layer 12 of $Si_3N_4$ on the insulating barrier covers the lateral sides of each gate 3. The layer 12 is formed by chemical vapor deposition, CVD, by way of example.

Figure 8:
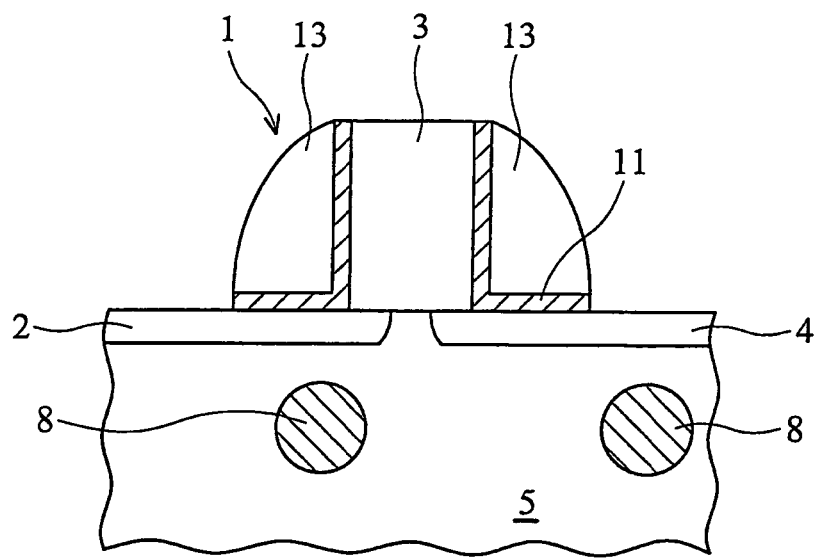
FIG. 8 is a schematic view of two process steps providing spacers on a semiconductor device.

FIG. 8 discloses a process of forming spacers 13 of $Si_3N_4$ material against the lateral sides of each gate 3. The spacers 13 are formed by dry etching the layer of $Si_3N_4$ and the spacers 13 are against an insulating thin layer 11 of $SiO_2$ on the sides of the gate 3. Portions of $SiO_2$ material are uncovered by the spacers 13. A process step of wet dipping in an etchant of $SiO_2$ removes the uncovered $SiO_2$ material.

Figure 9:
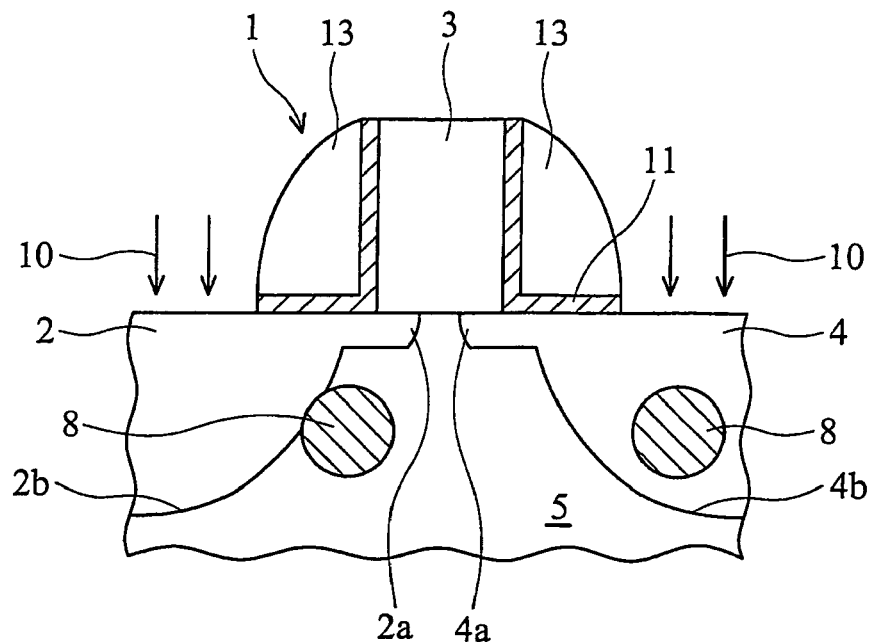
FIG. 9 is a schematic view of a process step of deep source-drain implantation and a process step of rapid thermal annealing to provide an asymmetric ion implant when the ion strength concentration of a second ion implant is countered.

FIG. 9 discloses a process step of deep source-drain implantation at zero tilt angle. This process step is a deep ion implantation at zero tilt angle of highly doped ions. Implanted ion impurities form a deep source portion 2b and a deep drain portion 4b. For example implanted Arsenic, As, forms implanted n+ source and n+ drain regions for NMOS transistors. Further, for example, Boron and/or Boron Fluoride, B and $BF_2$, impurities form implanted p+ source and p+ drain regions for PMOS transistors.

With continued reference to FIG. 9, the gate 3 and the spacer 13 cover the source side, primary implant 8 while ions of the deep source portion 2b are impelled along the vector 10 of zero tilt angle. The drain side, secondary implant 8 is uncovered by the gate 3 and any spacer 13 while ions of the deep drain portion 4b are impelled along the vector 10 of zero tilt angle. Thus the ions of the deep drain portion 4b are combined with the uncovered secondary implant 8 in the space occupied by the uncovered secondary implant 8. The doped polarity of the source 2 and drain 4, including the portions 2a, 2b, 4a and 4b, are opposite the doped polarity of the implants 8. For example, an Arsenic ion of the deep drain portion 4b has more free electrons than the single electron receptor of a Boron ion of the uncovered secondary implant 8. Thus, the polarity of the Boron ions in the secondary implant 8 is neutralized by the Arsenic ions. Further, the secondary implant 8 is surrounded by the ion distribution of the deep drain portion 4b. The secondary implant 8 is said to be countered by counter doped implanted ions of the deep drain portion 4b. Thus, the source side, primary implant 8 becomes an asymmetric ion implant, when the drain side, secondary implant 8 is countered by counter doped implanted ions.

With continued reference, to FIG. 9, a process step of rapid thermal annealing of the semiconductor device 1 is performed, to refine the crystalline structure and repair structural damage caused by ion implantation. Annealing causes joining of the source extension 2a and the deep source 2b. Annealing further causes joining of the drain extension 4a and the deep drain 4b.

Figure 10:
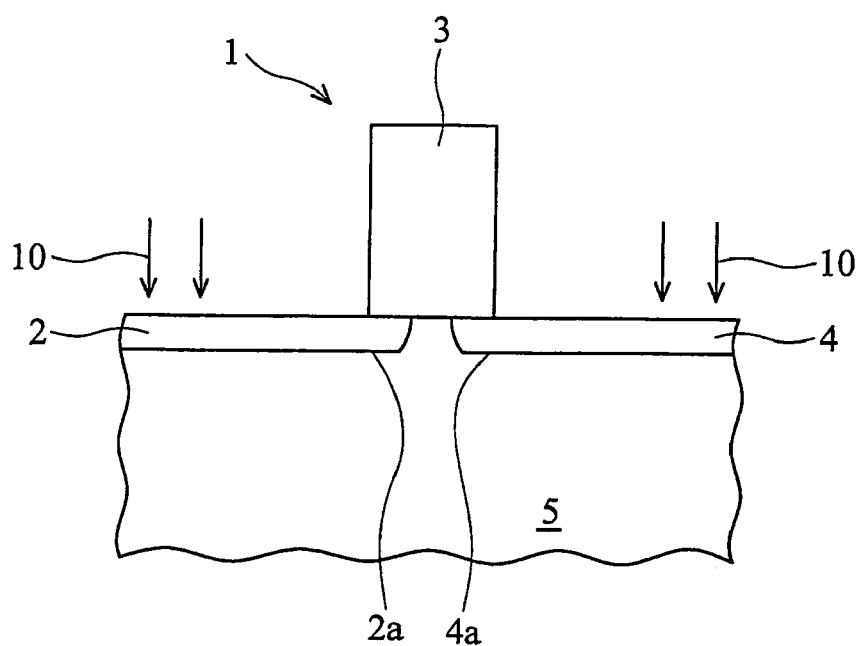
FIG. 10 is a schematic view of the process step of FIG. 5 applied to the embodiment of FIG. 4.

FIGS. 10–15 disclose how the process steps of FIGS. 5–9 apply to make the embodiment sD disclosed in FIG. 4. FIG. 10 discloses a light doped source 2a and a light doped drain 4a made by performing the process step disclosed by FIG. 5.

Figure 11:
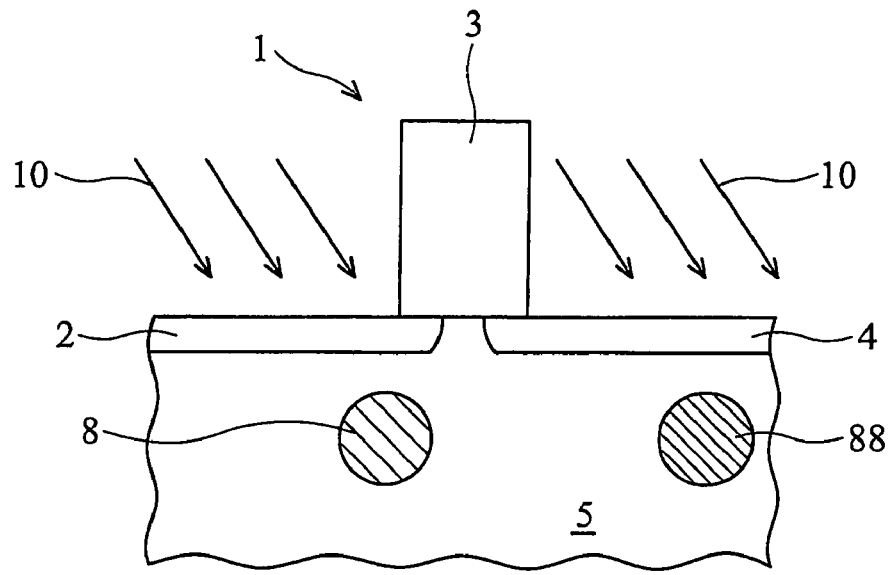
FIG. 11 is a schematic view of the process step of FIG. 6 applied to the embodiment of FIG. 4.

FIG. 11 discloses a deep pocket primary implant 8 formed by performing the process step of FIG. 6, with a tilt angle tilted to the source side of the semiconductor device 1. FIG. 11 discloses a deep pocket secondary implant 8 that is countered by ion implants to be further disclosed by FIG. 15.

Figure 12:
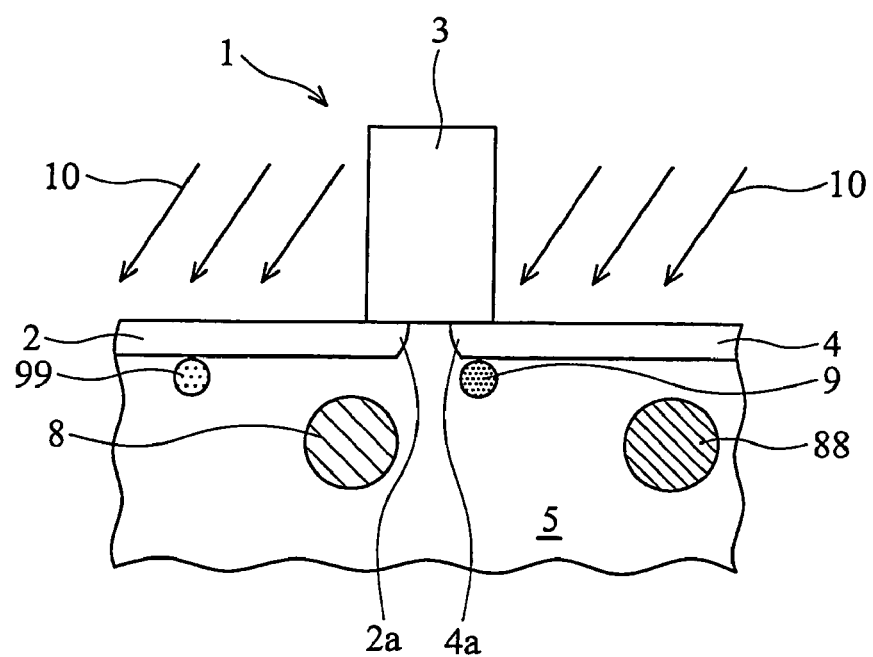
FIG. 12 is a schematic view of the process step of FIG. 6 applied a second time to the embodiment of FIG. 4.

FIG. 12 discloses a drain side, shallow pocket primary implant 9 and a shallow pocket secondary implant 9 formed by performing the process step of FIG. 6, by having the tilt angle tilted toward the drain side of the semiconductor device 1. The primary implant 9 is under the gate 3.

Figure 13:
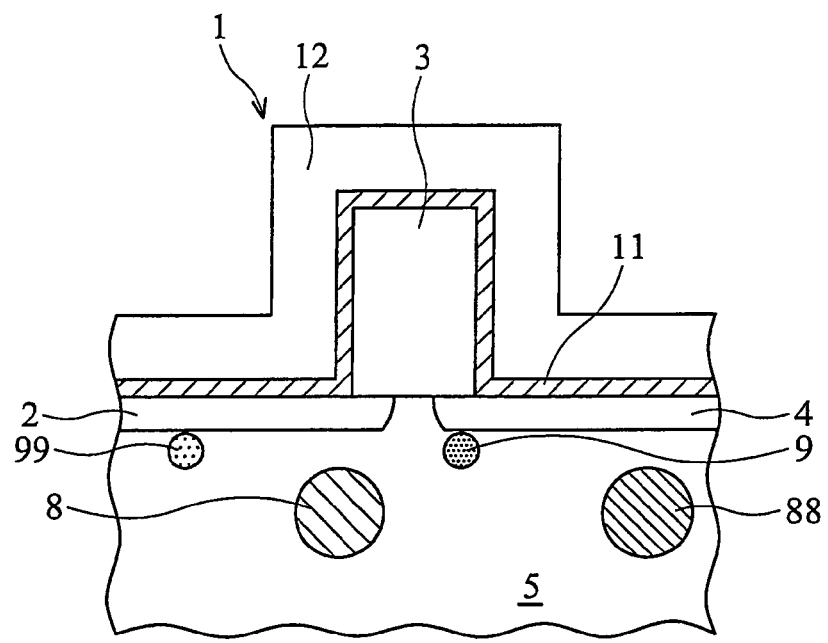
FIG. 13 is a schematic view of the two process steps of FIG. 7 applied to the embodiment of FIG. 4.

FIG. 13 discloses a thin layer of $SiO_2$ and a thicker layer of $Si_3N_4$ formed by performing the two process steps disclosed by FIG. 7.

Figure 14:
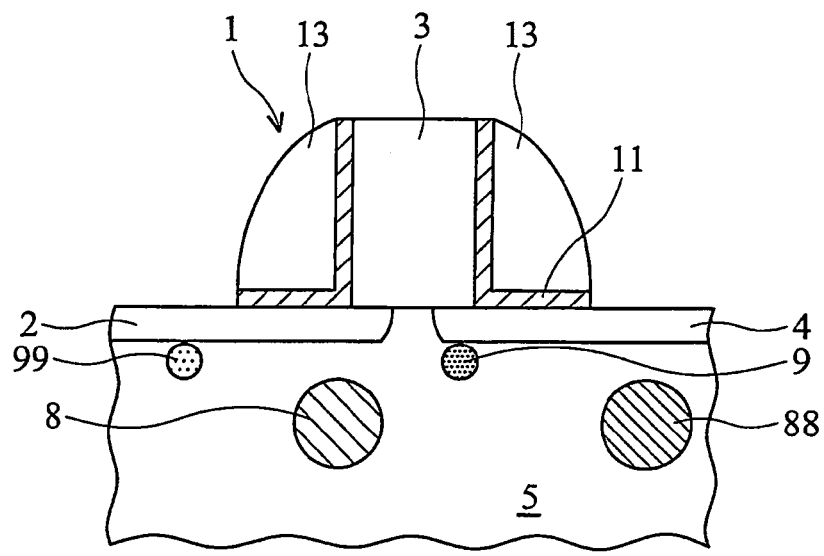
FIG. 14 is a schematic view of the two process steps of FIG. 8 applied to the embodiment of FIG. 4.

FIG. 14 discloses spacers 13 formed by the two process steps disclosed by FIG. 8.

Figure 15:
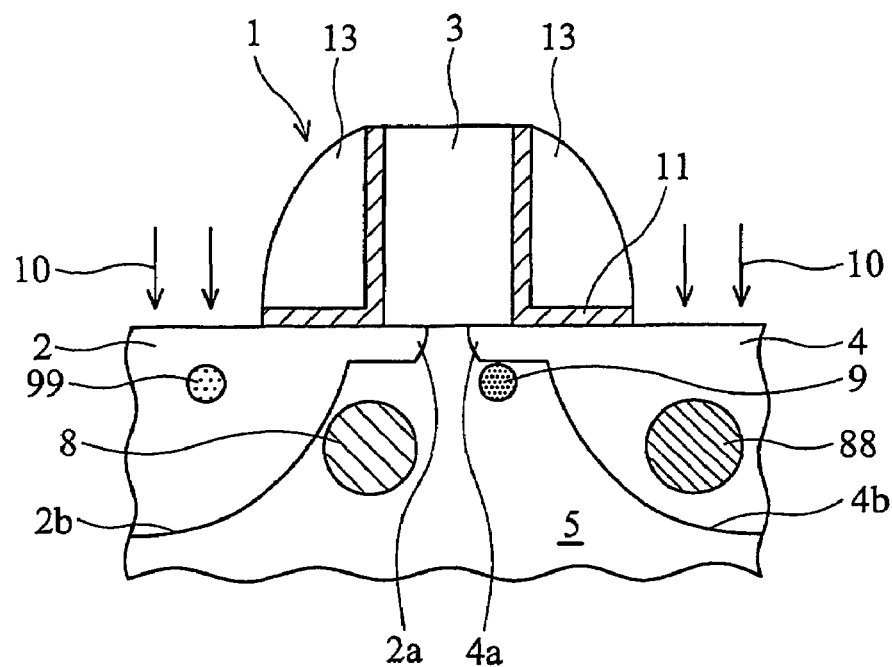
FIG. 15 is a schematic view of the two process steps of FIG. 9 applied to the embodiment of FIG. 4.

FIG. 15 discloses a deep source portion 2b and a deep drain portion 4b formed by the process step disclosed by FIG. 9. In FIG. 15, the source side, deep-pocket primary implant 8 and the drain side, shallow-pocket primary implant 9 become asymmetric ion implants in staggered configuration, respectively, when the deep-pocket secondary implant 8 and the shallow-pocket secondary implant 9 are countered. Then a process of rapid thermal annealing of the semiconductor device 1 is performed as disclosed by FIG. 9.

Figure 16:
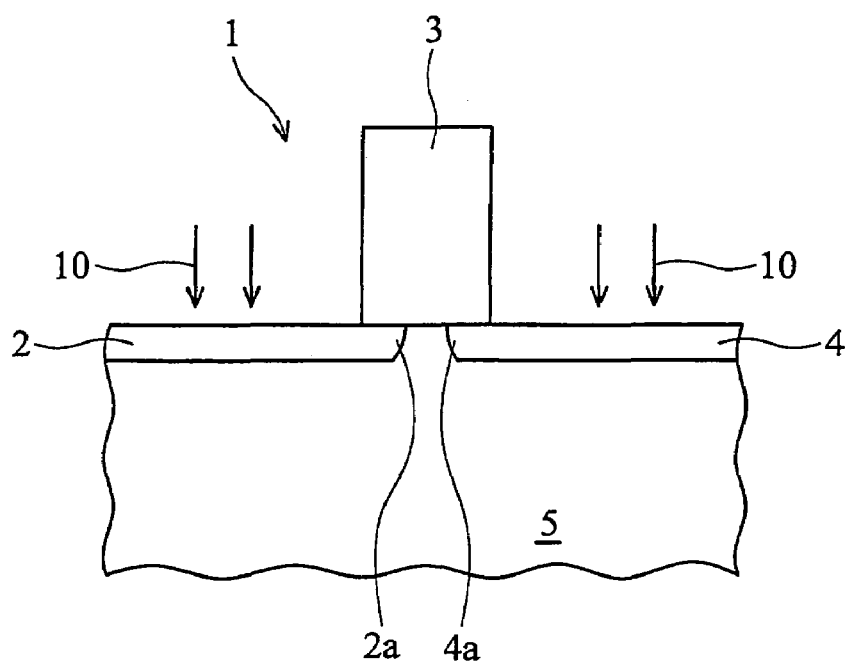
FIG. 16 is a schematic view of the process step of FIG. 5 applied to the embodiment of FIG. 3.

FIGS. 16–21 disclose how the process steps of FIGS. 5–9 apply to make the embodiment Sd disclosed by FIG. 3. FIG. 16 discloses a light doped source 2a and a light doped drain 4a made by performing the process step disclosed by FIG. 5.

Figure 17:
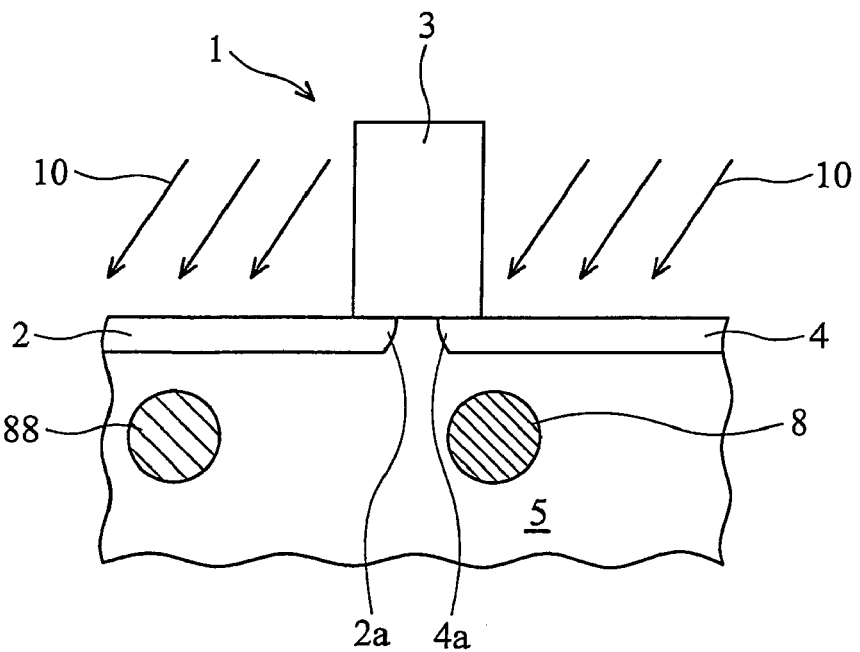
FIG. 17 is a schematic view of the process step of FIG. 6 applied to the embodiment of FIG. 3.

FIG. 17 discloses a drain side, deep pocket primary implant 8 formed by performing the process step of FIG. 6, with a tilt angle tilted to the drain side of the semiconductor device 1. FIG. 17 discloses a deep pocket secondary implant 8 that is countered by ion implants to be disclosed by FIG. 21.

Figure 18:
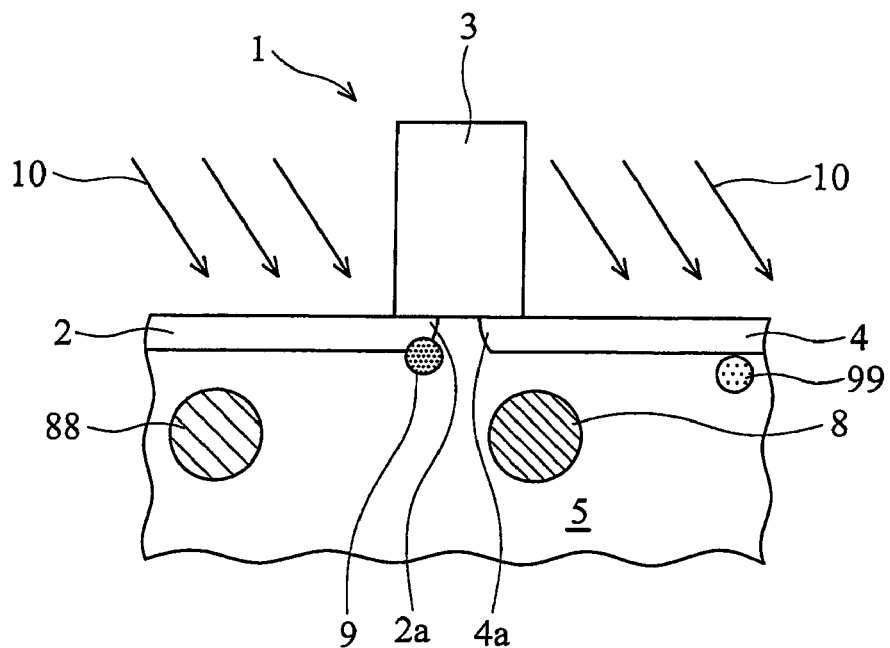
FIG. 18 is a schematic view of the process step of FIG. 6 applied a second time to the embodiment of FIG. 3.

FIG. 18 discloses a source side, shallow-pocket primary implant 9 and a drain side, shallow-pocket secondary implant 9 formed by performing the process step of FIG. 6, with the tilt angle tilted toward the source side of the semiconductor device 1. The primary implant 9 is under the gate 3 at the source side of the semiconductor device 1.

Figure 19:
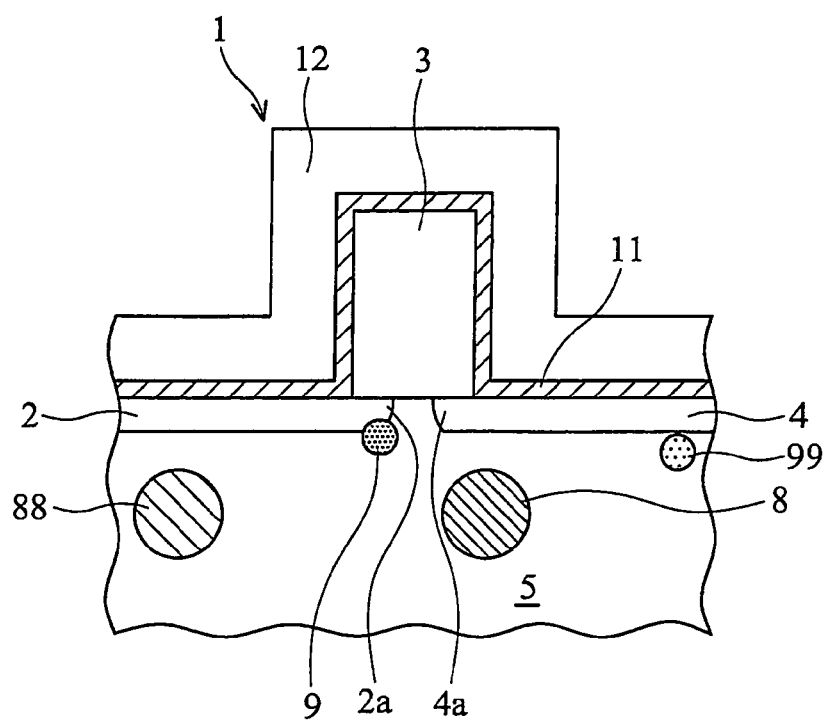
FIG. 19 is a schematic view of the two process steps of FIG. 7 applied to the embodiment of FIG. 3.

FIG. 19 discloses a thin layer of $SiO_2$ and a thicker layer of $Si_3N_4$ formed by the two process steps disclosed by FIG. 7.

Figure 20:
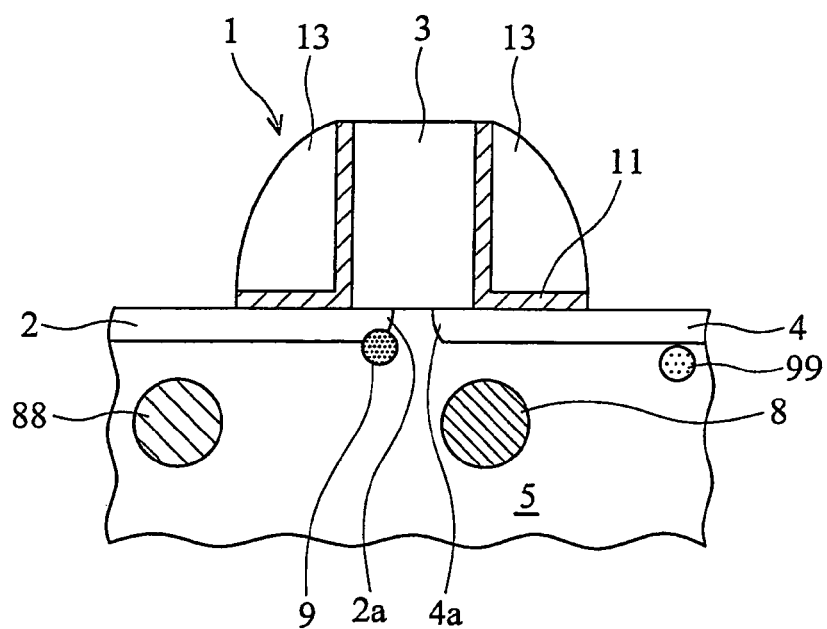
FIG. 20 is a schematic view of the two process steps of FIG. 8 applied to the embodiment of FIG. 3.

FIG. 20 discloses spacers 13 formed by the two process steps disclosed by FIG. 8.

Figure 21:
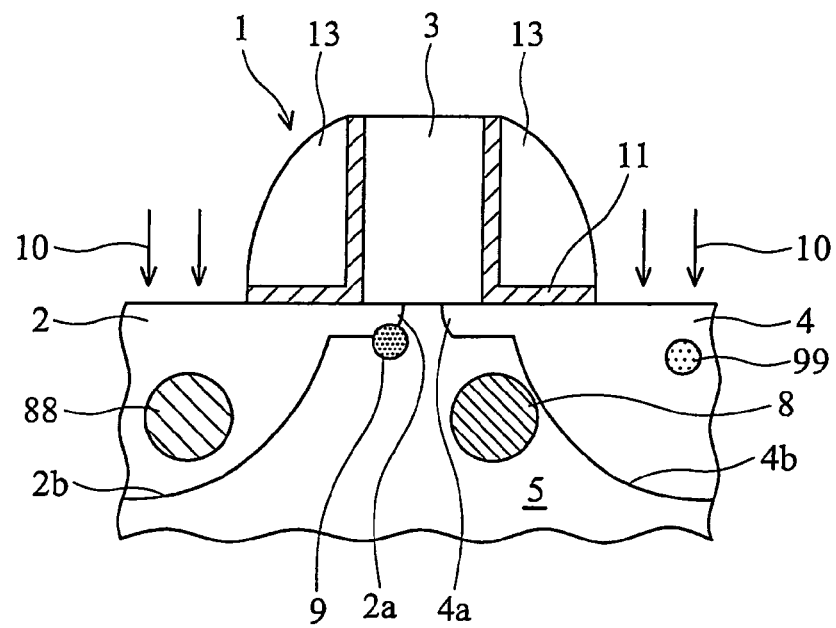
FIG. 21 is a schematic view of the two process steps of FIG. 9 applied to the embodiment of FIG. 3.

FIG. 21 discloses a deep source portion 2b and a deep drain portion 4b formed by the process disclosed by FIG. 9. In FIG. 21, the drain side, deep primary implant 8 and the source side, shallow primary implant 9 become asymmetric ion implants, respectively, when the deep-pocket secondary implant 8 and the shallow-pocket secondary implant 9 are countered. Then a process of rapid thermal annealing of the semiconductor device 1 is performed as disclosed by FIG. 9.

Figure 22:
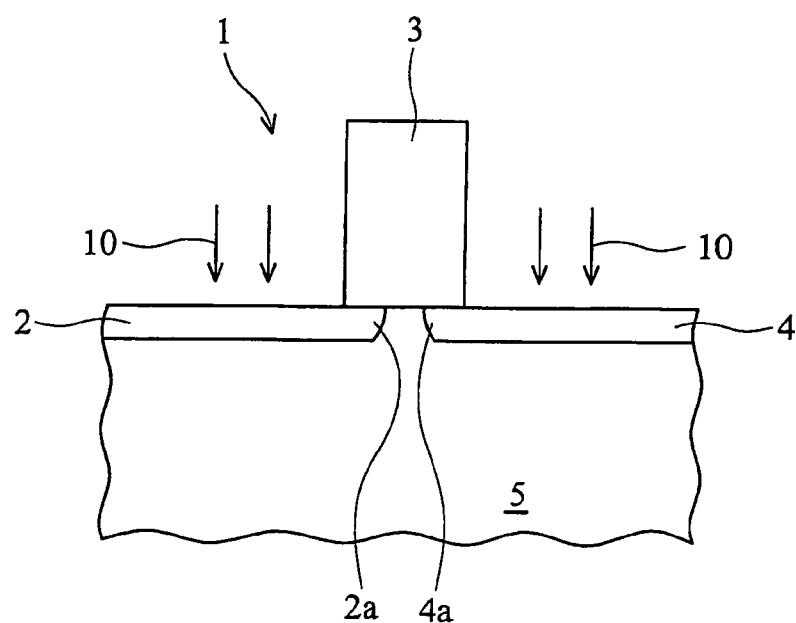
FIG. 22 is a schematic view of the process step of FIG. 5 applied to the embodiment of FIG. 1.

FIGS. 22–27 disclose how to make the embodiment Dd disclosed by FIG. 1. FIG. 22 discloses a shallow source extension 2a and a shallow drain extension 4a made by performing the process step disclosed by FIG. 5.

Figure 23:
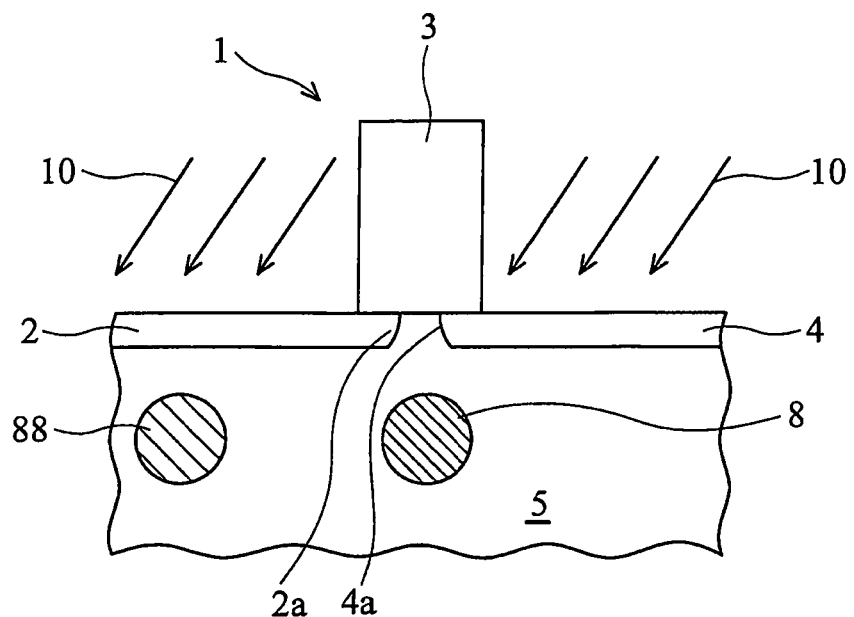
FIG. 23 is a schematic view of the process step of FIG. 6 applied to the embodiment of FIG. 1.

FIG. 23 discloses a drain side, deep pocket primary implant 8 formed by performing the process step of FIG. 6, with a tilt angle tilted to the drain side of the semiconductor device 1. FIG. 23 discloses a deep pocket secondary implant 8 that is countered by ion implants to be disclosed by FIG. 27.

Figure 24:
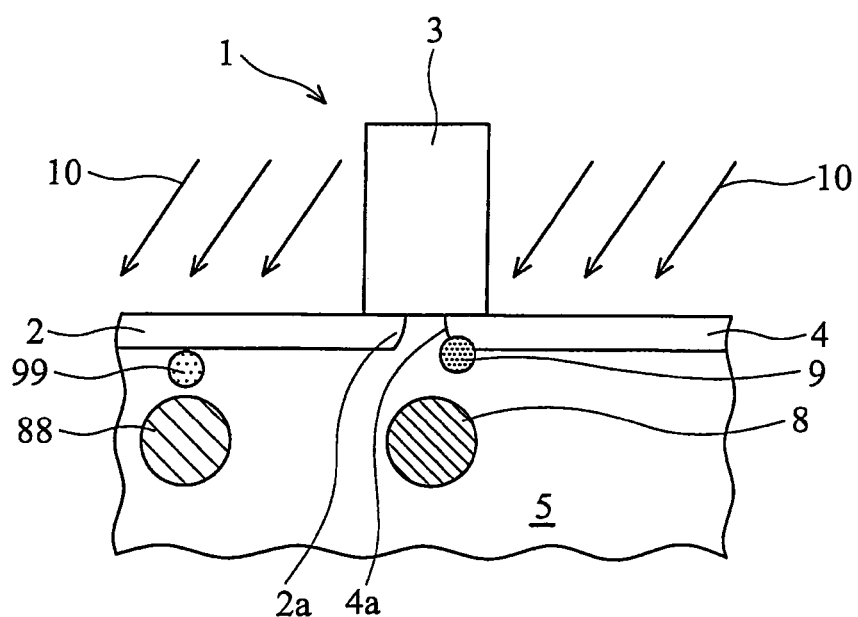
FIG. 24 is a schematic view of the process step of FIG. 6 applied a second time to the embodiment of FIG. 1.

FIG. 24 discloses a drain side, shallow pocket primary implant 9 and a shallow pocket secondary implant 9 formed by performing the process step of FIG. 6, by having the tilt angle tilted toward the drain side of the semiconductor device 1. The drain side, primary implant 9 is under the gate 3 at the drain side of the semiconductor device 1.

Figure 25:
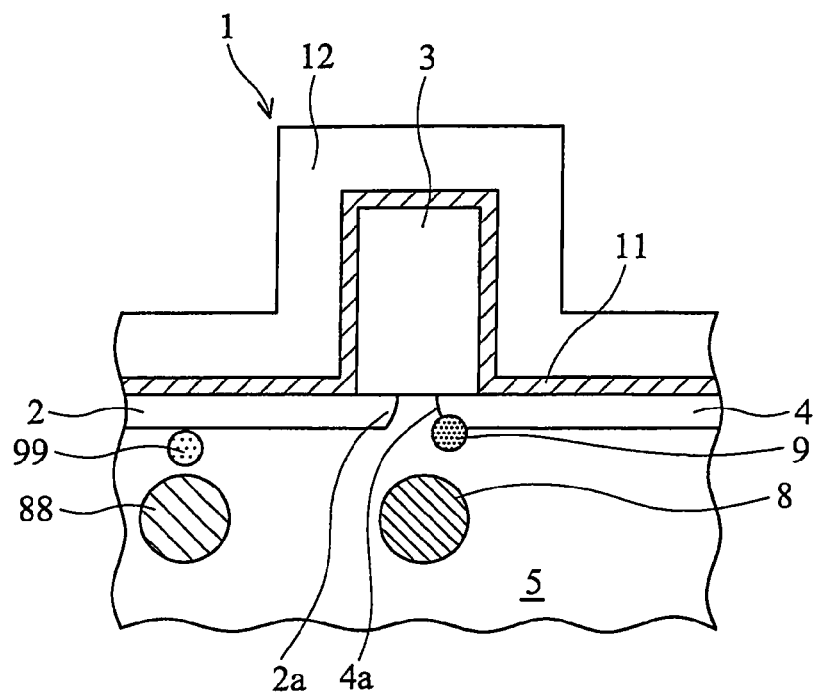
FIG. 25 is a schematic view of the two process steps of FIG. 7 applied to the embodiment of FIG. 1.

FIG. 25 discloses a thin layer of $SiO_2$ and a thicker layer of $Si_3N_4$ formed by the two process steps disclosed by FIG. 7.

Figure 26:
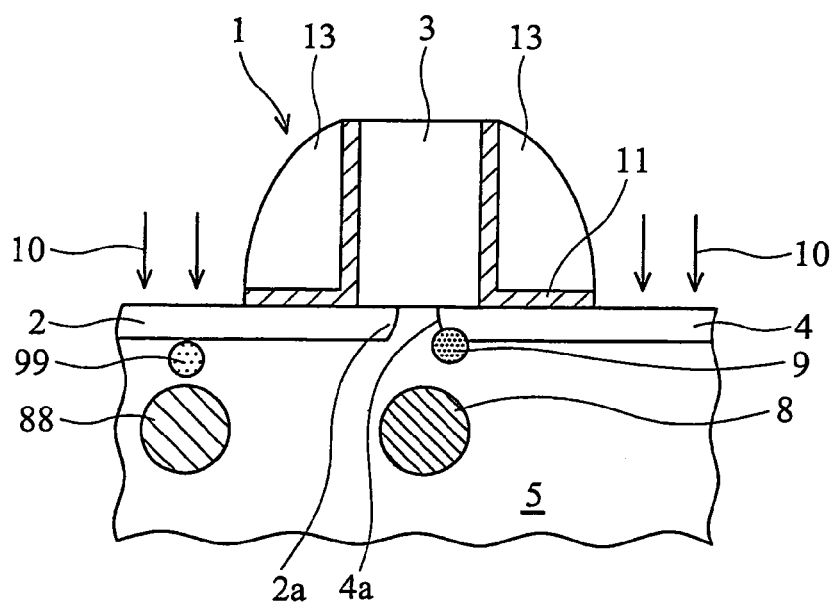
FIG. 26 is a schematic view of the two process steps of FIG. 8 applied to the embodiment of FIG. 1.

FIG. 26 discloses spacers 13 formed by the two process steps disclosed by FIG. 8.

Figure 27:
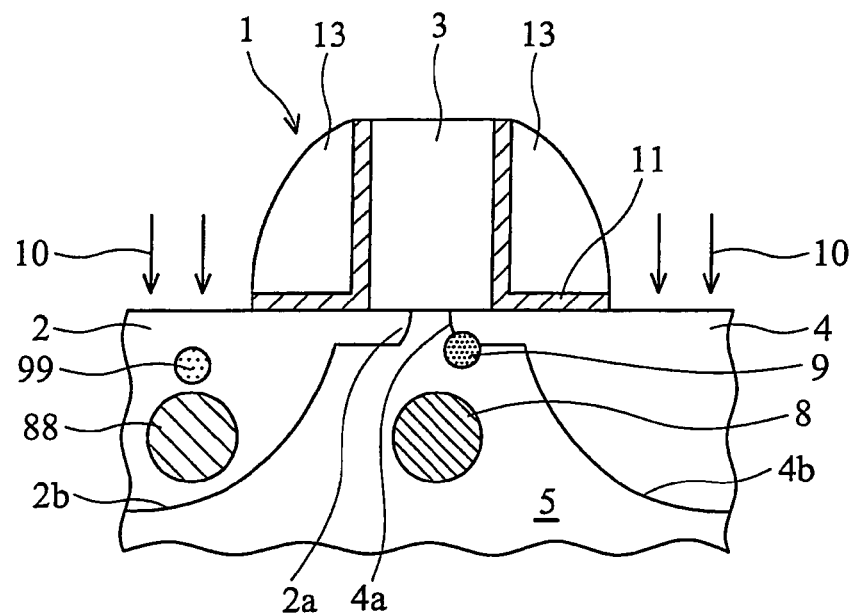
FIG. 27 is a schematic view of the two process steps of FIG. 9 applied to the embodiment of FIG. 1.

FIG. 27 discloses a deep source portion 2b and a deep drain portion 4b formed by the process disclosed by FIG. 9. In FIG. 27, the drain side primary deep implant 8 and the drain side primary shallow implant 9 become asymmetric ion implants, respectively, when the deep-pocket secondary implant 8 and the shallow-pocket secondary implant 9 are countered. Then a process of rapid thermal annealing of the semiconductor device 1 is performed, as disclosed by FIG. 9.

Figure 28:
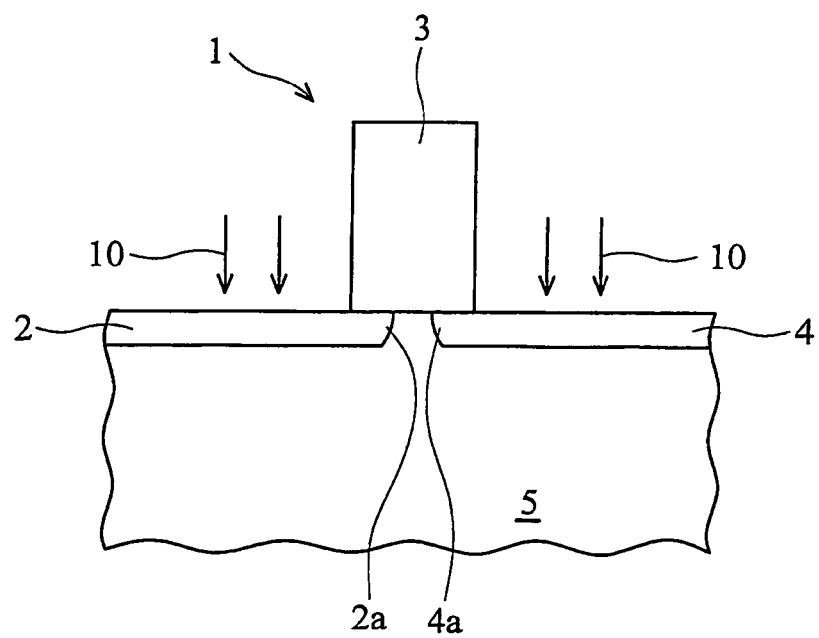
FIG. 28 is a schematic view of the process step of FIG. 5 applied to the embodiment of FIG. 2.

FIGS. 28–33 disclose how the process steps of FIGS. 5–9 apply to make the embodiment Ss as disclosed by FIG. 2. FIG. 28 discloses a light doped source 2a and a light doped drain 4a made by performing the process step disclosed by FIG. 5.

Figure 29:
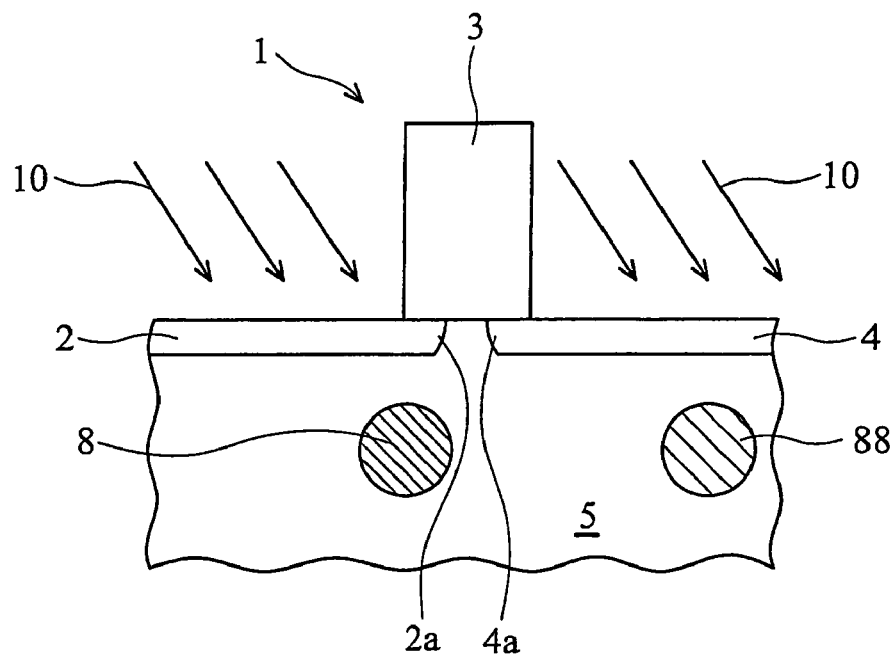
FIG. 29 is a schematic view of the process step of FIG. 6 applied to the embodiment of FIG. 2.

FIG. 29 discloses a source side, deep pocket primary implant 8 formed by performing the process step of FIG. 6, with a tilt angle tilted to the source side of the semiconductor device 1. FIG. 29 discloses a deep pocket secondary implant 8 that is countered by ion implants to be disclosed by FIG. 33.

Figure 30:
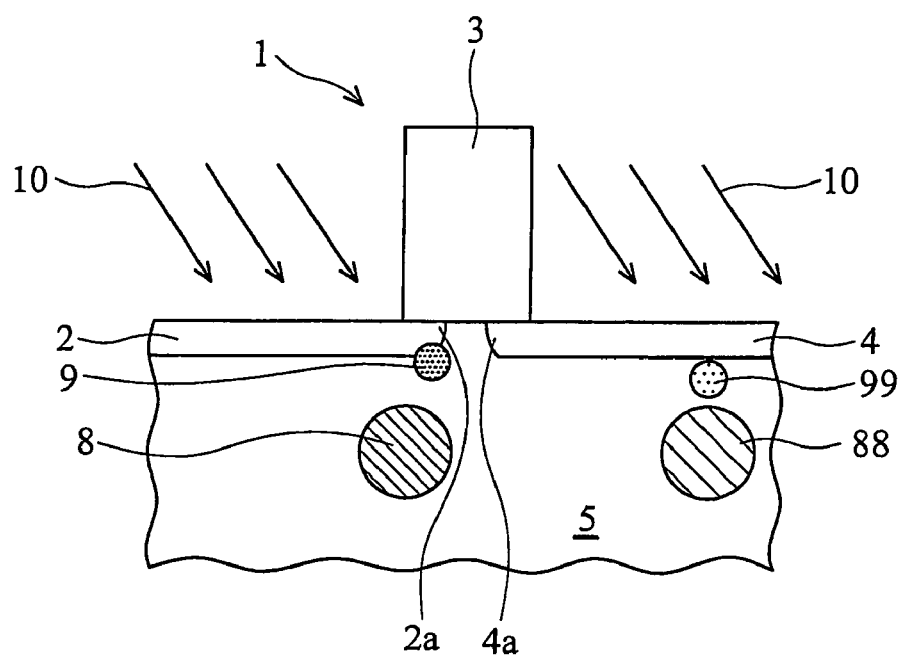
FIG. 30 is a schematic view of the process step of FIG. 6 applied a second time to the embodiment of FIG. 2.

FIG. 30 discloses a source side, shallow pocket primary implant 9 and a shallow pocket secondary implant 9 formed by performing the process step of FIG. 6, by having the tilt angle tilted toward the source side of the semiconductor device 1. The source side, primary implant 8 is under the gate 3 at the source side of the semiconductor device 1.

Figure 31:
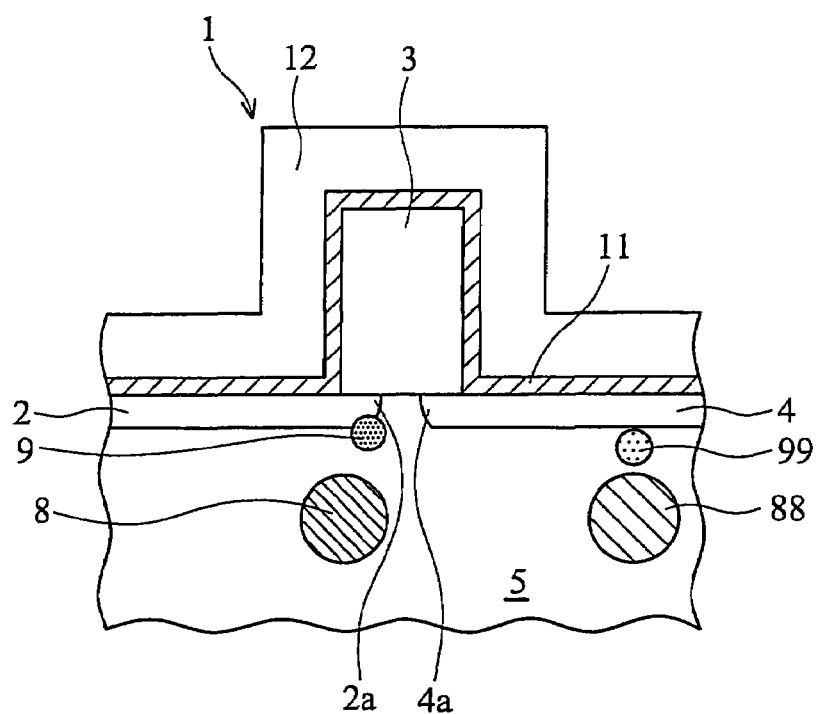
FIG. 31 is a schematic view of the two process steps of FIG. 7 applied to the embodiment of FIG. 2.

FIG. 31 discloses a thin layer of $SiO_2$ and a thicker layer of $Si_3N_4$ formed by the two process steps disclosed by FIG. 7.

Figure 32:
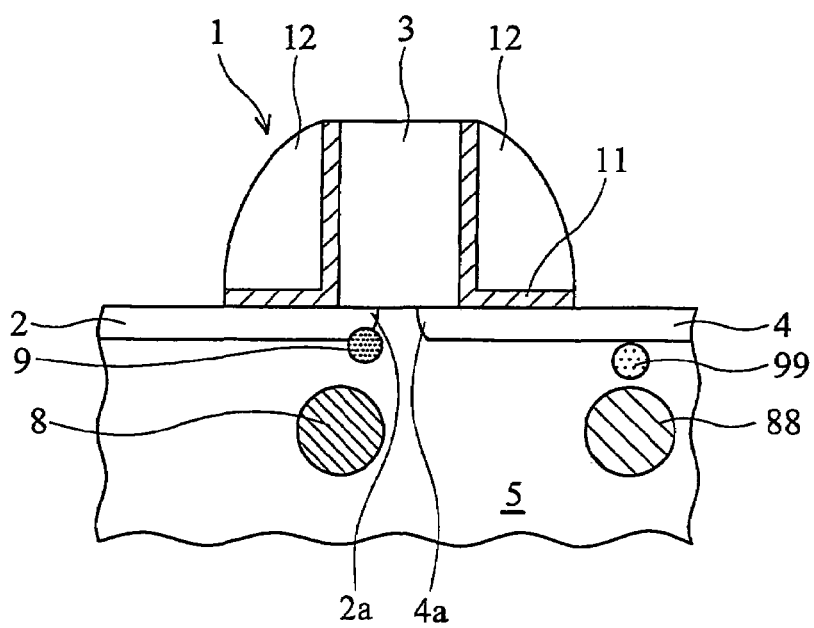
FIG. 32 is a schematic view of the two process steps of FIG. 8 applied to the embodiment of FIG. 2.

FIG. 32 discloses spacers 13 formed by the two process steps disclosed by FIG. 8.

Figure 33:
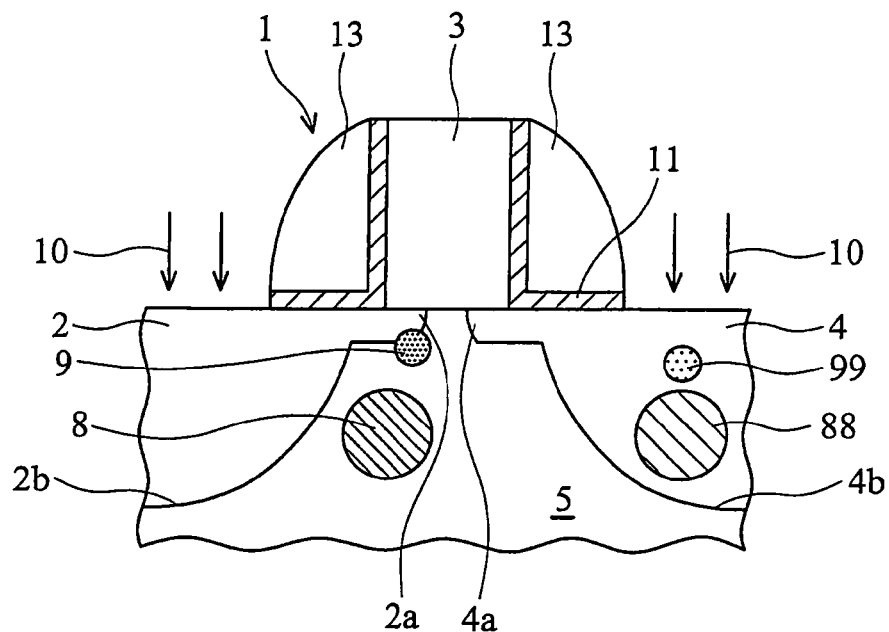
FIG. 33 is a schematic view of the two process steps of FIG. 9 applied to the embodiment of FIG. 2.

FIG. 33 discloses a deep source portion 2b and a deep drain portion 4b formed by the process disclosed by FIG. 9. In FIG. 33, the source side, deep primary implant 8 and the source side, shallow primary implant 9 become asymmetric ion implants, respectively, when the deep-pocket secondary implant 8 and the shallow-pocket secondary implant 9 are countered. Then a process of rapid thermal annealing of the semiconductor device 1 is performed as disclosed by FIG. 9.

Figure 34:
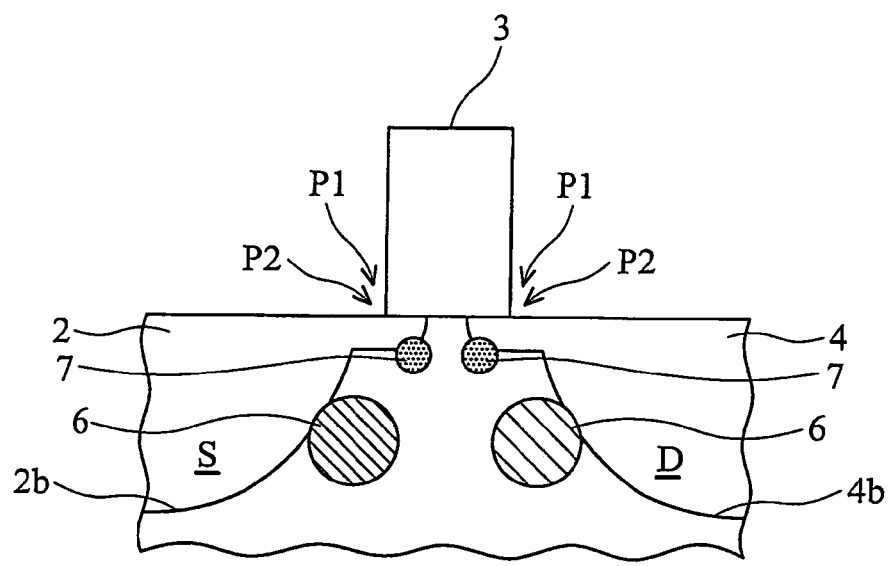
FIG. 34 is a schematic view of a semiconductor device having two sets of symmetric ion implants.

FIG. 34 discloses an embodiment SD of a semiconductor device 1 with a set of two deep-pocket primary implants 8, and a set of two shallow-pocket primary implants 9. Further, the implants are known as, symmetric halo implants, meaning that they are imbedded at the same level, and further, they are symmetrically spaced apart. The embodiment SD is manufactured with symmetric halo implants as proposed by U.S. Pat. No. 6,344,405 and FR 2796204.

According to each of the embodiments disclosed in FIGS. 1–4, the shallow-pocket ion implant 9 has both, a smaller size and a heavier ion dose, in contrast to the deep-pocket ion implant 8 having a larger size and smaller dose of ions. The shallow-pocket ion implant 9 is implanted by a lower level of implanting energy, in contrast to the deep-pocket ion implant 8 being implanted by a higher level of implanting energy. For a PMOSFET, the deep-pocket ion implant 8 is doped with Arsenic (As) impurity. Each of the embodiments disclosed by FIGS. 1–4 are manufactured with ion implants 8 and 9 according to the following Table. The Table further discloses the device of FIG. 34 manufactured with symmetric halo implants.

TABLE I

| Embodiment/pocket | Implant Energy (KeV) | Implant Dose ($10^{13}$ cm$^{-2}$) | Tilt Angle From Vertical (Degrees) |
|---|---|---|---|
| Dd/ deep-pocket | 30 | 1.0 | 15 |
| Dd/ shallow pocket | 20 | 1.2 | 30 |
| Ss/ deep-pocket | 30 | 1.0 | 15 |
| Ss/ shallow pocket | 20 | 1.2 | 30 |
| Sd/ deep-pocket | 30 | 1.0 | 15 |
| Sd/ shallow pocket | 20 | 1.5 | 30 |
| sD/ deep-pocket | 30 | 1.0 | 15 |
| sD/ shallow pocket | 20 | 1.5 | 30 |
| SD/ deep-pocket | 30 | 1.5 | 15 |
| SD/ shallow pocket | 20 | 2.5 | 30 |

Figure 35:
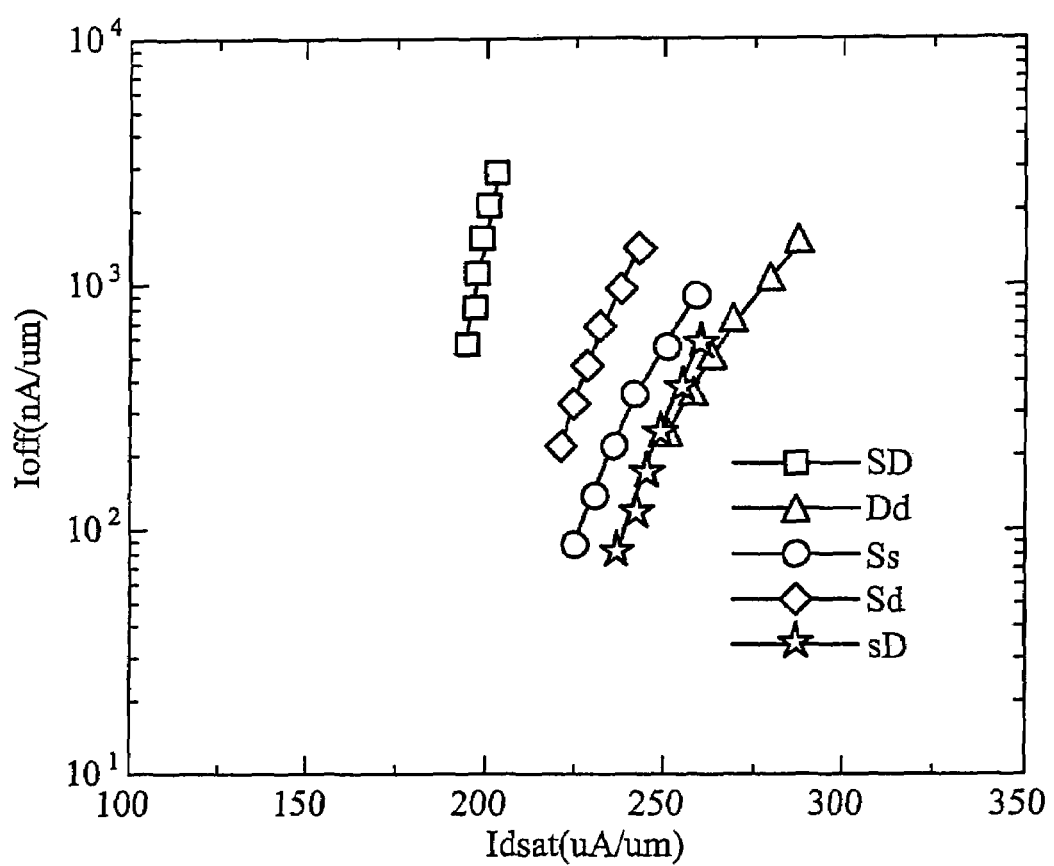
FIG. 35 is a graph of device performance compared with performance of a device having symmetric halo implants.

FIG. 35 discloses device performance of each of the embodiments Dd, Ss, Sd and sD of FIGS. 1–4, as compared with the device performance of the device SD of FIG. 34., wherein device stand-by current $I_{off}$ in nano-Amps per micrometer is plotted against device driving current $I_{dsat}$ in micro-Amps per micrometer.

Figure 36:
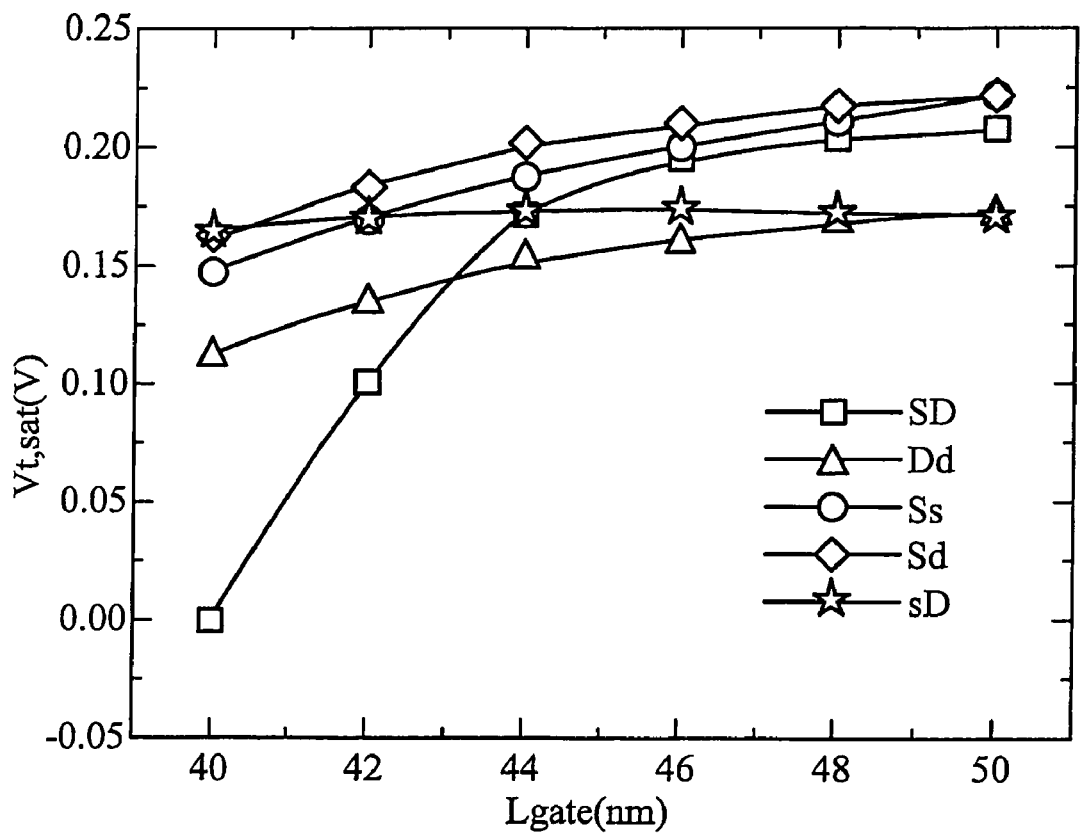
FIG. 36 is a graph indicating SCE or punch through effect on device performance as a function of gate length.

FIG. 36 discloses the SCE or punch through effect on device performance as a function of gate length $L_{gate}$ in nanometers. The SCE or punch through effect is indicated for each of the embodiments Dd, Ss, Sd and sD of FIGS. 1–4, as compared with the device performance of the device SD of FIG. 34, wherein $V_t$ roll-off, $V_{t,\,sat}$ in Volts is plotted against reductions in gate length.

As indicated by FIGS. 35 and 36, symmetric halo implants of the embodiment SD are associated with the following drawbacks. They tend to increase the apparent sheet resistance of the source and the drain, which decreases the driving current, $I_{dsat}$, when the semiconductor is in a conducting state. Further, they tend to induce a parasitic junction capacitance at both the source-substrate junction and the drain-substrate junction, which degrades the circuit impedance and signal transmission speed. Further, leakage current in the deletion area at both the source-substrate junction and the drain-substrate junction is increased by the presence of the halo implants, which increases lost power consumption and heat generation. Further, as gate length, $L_{gate}$, is desirably reduced to make a smaller device, the threshold voltage $V_t$ correspondingly decreases, which is an undesired effect known as, $V_t$ roll-off.

Symmetric halo implants are always confined to being in a symmetrical arrangement with respect to each other, and thereby, are unsuccessful in countering $V_t$ roll-off. In contrast, the respective locations of the single asymmetric deep-pocket ion implant 8, and the single asymmetric shallow-pocket ion implant 9 of embodiments Dd, Ss, Sd and sD are chosen independently, which individually adjusts the locations of the pocket implants 8 and 9 to counter $V_t$ roll-off. For example, FIG. 36 indicates that $V_t$ roll-off is countered effectively by the embodiment sD, FIG. 4, of the present invention, wherein the deep-pocket ion implant 8 is at or near the source 2, and further wherein, the shallow-pocket ion implant 9 is at or near the drain 4.

The embodiments disclosed herein, as well as, further embodiments and modifications of the present invention, are intended to be covered by the spirit and scope of the appended claims.

What is claimed is:

1. A semiconductor device comprising:
a source, a gate and a drain;
a source-drain depletion region in a substrate under the gate;
a single deep-pocket ion implant and a single shallow-pocket ion implant provided in the source-drain depletion region in a staggered configuration, wherein the semiconductor device contains only one deep-pocket ion implant and only one shallow-pocket ion implant.

2. The semiconductor device as recited in claim 1, further comprising:
a secondary deep-pocket ion implant in a source side of the source-drain depletion region, the secondary deep-pocket ion implant having been countered by ions of the source; and
a secondary shallow-pocket ion implant in a drain side of the source-drain depletion region, the secondary shallow-pocket ion implant having been countered by ions of the drain.

3. The semiconductor device of claim 1, wherein the single deep-pocket ion implant is in the source-drain depletion region is at a drain side and the single shallow-pocket ion implant in the source-drain depletion region is at a source side.

4. The semiconductor device of claim 1, wherein the single deep-pocket ion implant is in the source-drain depletion region is at a source side and the single shallow-pocket ion implant in the source-drain depletion region is at a drain side.

5. A semiconductor device comprising:
a source, a gate and a drain;
a source-drain depletion region in a substrate under the gate;
a single deep-pocket ion implant in the source-drain depletion region at a drain side;
a single shallow-pocket ion implant in the source-drain depletion region at a source side;
a secondary deep-pocket ion implant in a source side of the source-drain depletion region, the secondary deep-pocket ion implant having been countered by ions of the source; and
a secondary shallow-pocket ion implant in a drain side of the source-drain depletion region, the secondary shallow-pocket ion implant having been countered by ions of the drain.

6. A semiconductor device comprising:
a source, a gate and a drain;
a source-drain depletion region in a substrate under the gate;
a single deep-pocket ion implant in the source-drain depletion region at a source side;
a single shallow-pocket ion implant in the source-drain depletion region at a drain side;
a secondary deep-pocket ion implant in a drain side of the source-drain depletion region, the secondary deep-pocket ion implant having been countered by ions of the drain; and
a secondary shallow-pocket ion implant in a source side of the source-drain depletion region, the secondary shallow-pocket ion implant having been countered by ions of the source.

* * * * *